United States Patent
Spessot et al.

(10) Patent No.: US 9,117,519 B2
(45) Date of Patent: Aug. 25, 2015

(54) METHODS, DEVICES AND SYSTEMS USING OVER-RESET STATE IN A MEMORY CELL

(75) Inventors: Alessio Spessot, Leuven (BE); Paolo Fantini, Vimercate (IT); Massimo Ferro, Camisano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 243 days.

(21) Appl. No.: 13/597,692

(22) Filed: Aug. 29, 2012

(65) Prior Publication Data

US 2014/0063899 A1 Mar. 6, 2014

(51) Int. Cl.
- G11C 13/04 (2006.01)
- G11C 13/00 (2006.01)
- G11C 11/56 (2006.01)

(52) U.S. Cl.
CPC ........ G11C 13/0069 (2013.01); G11C 11/5678 (2013.01); G11C 13/0004 (2013.01); *G11C 2213/52* (2013.01)

(58) Field of Classification Search
CPC ............. G11C 13/004; G11C 13/0069; G11C 11/5678
USPC .............................................. 365/163, 185.29
See application file for complete search history.

(56) References Cited

U.S. PATENT DOCUMENTS

| | | | |
|---|---|---|---|
| 5,751,637 A | 5/1998 | Chen et al. | |
| 7,151,701 B2 | 12/2006 | Combe et al. | |
| 7,440,315 B2 | 10/2008 | Lung | |
| 7,515,460 B2 | 4/2009 | Gordon et al. | |
| 7,522,449 B2 | 4/2009 | Ro et al. | |
| 7,885,101 B2 | 2/2011 | Bedeschi et al. | |
| 7,894,237 B2 | 2/2011 | Karpov et al. | |
| 7,898,847 B2 | 3/2011 | Philipp | |
| 7,929,336 B2 | 4/2011 | Philipp et al. | |
| 7,944,740 B2 | 5/2011 | Lam et al. | |
| 7,952,919 B2 | 5/2011 | Liu et al. | |
| 8,000,127 B2 | 8/2011 | Hamilton et al. | |
| 8,036,014 B2 | 10/2011 | Lee et al. | |
| 2009/0052235 A1* | 2/2009 | Horii et al. | 365/163 |
| 2009/0231912 A1* | 9/2009 | Liu | 365/163 |
| 2010/0012913 A1 | 1/2010 | Lee | |
| 2010/0284212 A1 | 11/2010 | Bedeschi et al. | |
| 2011/0051508 A1 | 3/2011 | Eleftheriou et al. | |
| 2011/0051521 A1 | 3/2011 | Levy et al. | |
| 2011/0069539 A1 | 3/2011 | Eleftheriou et al. | |
| 2011/0122685 A1 | 5/2011 | Kang et al. | |
| 2012/0147667 A1 | 6/2012 | Chen | |

FOREIGN PATENT DOCUMENTS

KR 20090097726 9/2009

OTHER PUBLICATIONS

U.S. Appl. No. 13/275,901, filed Oct. 18, 2011 in 28 pages.
U.S. Appl. No. 13/286,375, filed Nov. 11, 2011 in 27 pages.
U.S. Appl. No. 13/466,851, filed May 8, 2012 in 29 pages.
U.S. Appl. No. 13/597,639, filed Aug. 29, 2012 in 22 pages.

* cited by examiner

*Primary Examiner* — Jason Lappas
(74) *Attorney, Agent, or Firm* — Knobbe, Martens, Olson & Bear LLP (57) ABSTRACT

Memory cells, devices and methods are disclosed, including those that involve applying a waveform to a resistive memory cell to program the memory cell to an over-reset state representing a logic value.

18 Claims, 3 Drawing Sheets

METHODS, DEVICES AND SYSTEMS USING OVER-RESET STATE IN A MEMORY CELL

FIELD

Subject matter disclosed herein relates to memory technology, such as phase change memory.

BACKGROUND

Integrated circuit devices, which may include memory devices, for example, may be found in a wide range of electronic devices. For example, memory devices may be used in computers, digital cameras, cellular telephones, removable flash memory devices, and so forth. When selecting a memory technology for an application, a system designer may consider a physical size of a particular device, storage density, operating voltages, longevity and device stability over time, read/write speed, and/or power consumption, for example. Other example factors that may be of interest to memory system designers may include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, claimed subject matter may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other implementations may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

In some implementations, a method may be applied to a resistive memory cell wherein the method may include applying a waveform to a resistive memory cell (e.g., a phase change memory cell) to program the memory cell to an over-reset state representing a logic value. Such a waveform may comprise any of various profiles, such as triangular, trapezoidal, or other profile, or combinations thereof, and may have a fall time, for example, of between about 5.0 nanoseconds and about 100.0 nanoseconds. In some implementations, the memory cell may be programmed to a selected one of a plurality of over-reset states. For example, multiple over-reset states by application of different programming pulses, together with the set state, for example, can provide 3, 4, 5 or more different resistive states for one cell. This can allow for multi-bit storage of information states, such as four information states (e.g., three over-reset states and a set state) representing logic values comprising two bits, such as [00], [01], [10], and [11]. However, it should be noted that claimed subject matter is not limited in this respect.

In an implementation, a system for programming a resistive memory cell, such as a phase change memory cell, to an over-reset state may comprise an array of memory cells. A system may further comprise a controller coupled to an array of memory cells and configured to apply a waveform to a selected memory cell of the array of memory cells to program the selected memory cell to a selected one of a plurality of over-reset states. As used herein, a controller can refer to hardware, machine code, firmware, or software, whether individually or in combination or sub-combination. For example, in some implementations a control unit, such as the control unit 40 described with respect to FIG. 1, may be considered a "controller." In other implementations, a processor, such as processor 20 described with respect to FIG. 1, may be considered a "controller" or to include a "controller." In still other implementations, a combination of a control unit and at least a portion of a processor can be considered a "controller." Still further, a "controller" can, in some implementations, be on (or at least in part on) the same semiconductor die or in the same package as an array of memory cells; while, in other implementations, a "controller" can be on a separate die or in a separate package, for example, from a die or package including an array of memory cells. Examples of controllers can include, but are not limited to, control circuitry, state machines, ASICs, FPGAs, and the like. It should be noted however that claimed subject matter is not limited in this respect.

The controller can adjust programming waveforms for any of several purposes. For example, a single programming waveform can be adjusted to provide multiple waveforms that can be used to program a memory cell to a plurality of over-reset states, e.g., OVER-RESET 1, OVER-RESET 2, etc. Additionally and/or alternatively, a programming waveform can be adjusted to compensate for resistivity drift over time for a corresponding over-reset state.

Figure 1:
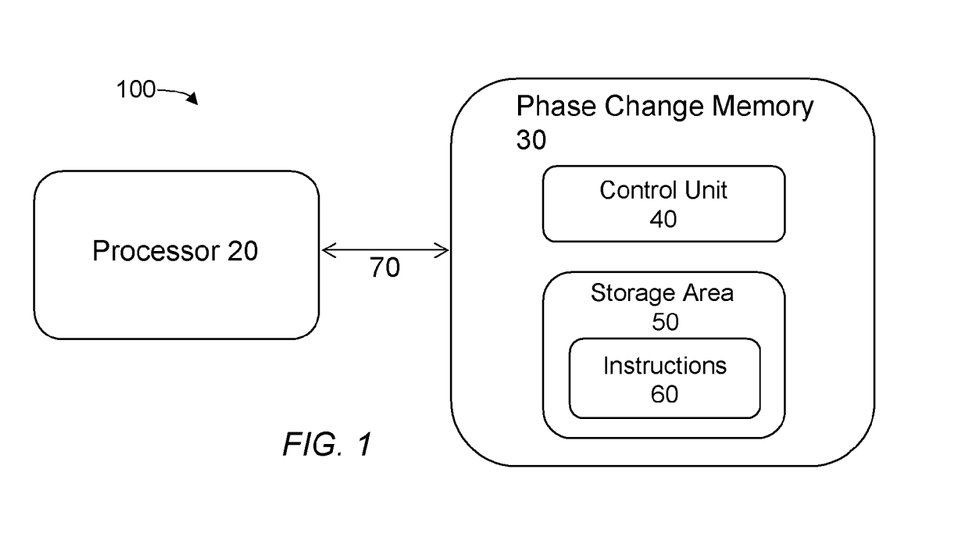
FIG. 1 is a schematic diagram depicting an example computing platform including a phase change memory device according to an implementation.

FIG. 1 is a schematic diagram (100) depicting an example computing platform including a resistive memory device according to an implementation. In some implementations, a resistive memory may comprise a phase change memory 30 that may comprise a storage area 50, including one or more memory arrays, such as arrays of multi-bit phase change memory cells, in accordance with one or more examples. The phase change memory 30 may, for example, be coupled to a processor 20 by way of a communication bus, such as the illustrated communication bus 70.

In an implementation, the phase change memory 30 may comprise a control unit 40, which may serve to calibrate and/or otherwise adjust one or more programming waveforms used to program memory cells within the storage area 50. Additionally, the storage area 50 may store instructions 60 that may include one or more applications that may be executed by the processor 20, for example. The processor 20 may transmit a memory access command to the control unit 40 of the phase change memory 30, for example. The control unit 40 may access one or more memory cells of the storage area 50, at least in part, in response to receiving a memory access command from the processor 20. Of course, the computing platform 100 is merely one illustrative example of an implementation and the scope of claimed subject matter is not limited in these respects.

In an implementation, one or more phase change memory cells of storage area 50 may comprise a phase change material, such as a chalcogenide glass material. A single-bit phase change memory cell may store (e.g., retain) data by being programmed to a selected one of two different information states. For example, in a single-bit system, a first information state (e.g., a "RESET" state) may represent a binary logic value "0" and a second information state (e.g., a "SET" state) may represent a binary logic value of "1." In an implementation, a "SET" state representing binary logic value [1], for example, may exhibit a crystalline, more conductive state of a material of a memory cell, such as one or more memory cells of the storage area 50. Also, in an implementation, a "RESET" state representing binary logic value [0], for example, may exhibit an amorphous, more resistive state of a material of a memory cell, such as one or more memory cells of the storage area 50. A SET programming operation can thus represent crystallizing or otherwise attaining a lower resistance state compared to the RESET state, whereas a RESET operation can represent melting, amorphizing or otherwise attaining a higher resistance state compared to the SET state.

In an implementation such as a multi-bit phase change memory system, information states representing logic values in addition to "0" and "1" may be stored in memory cells of a memory array. For example, a phase change memory cell may be capable of storing information states representing logic values expressed by way of two bits, such as [00], [01], [10], and [11]. In some implementations, information states may be determined by sensing (e.g., reading) particular voltages or read currents at a memory cell in response to an applied signal, such as a voltage signal, for example. However, it should be noted that claimed subject matter is not limited in these respects.

In a phase change memory, such as phase change memory 30, applying an electric current comprising sufficient amplitude and/or duration may result in a state (e.g., phase) change of an individual memory cell, such as an individual cell of storage area 50. In some implementations, Joule (i.e., resistive or ohmic) heat may be generated as a result of a use of electric current, for example. Heat may be generated, for example, as a consequence of current flow through a particular phase change material (self-heating) or may be generated as a result of a heating element thermally coupled to a phase change material, for example. Further, in one or more implementations, memory arrays may comprise one or more technologies other than phase change memory, such as other resistive memory technologies and/or other types of memory. Claimed subject matter is not limited in scope to illustrative examples such as these.

Figure 2:
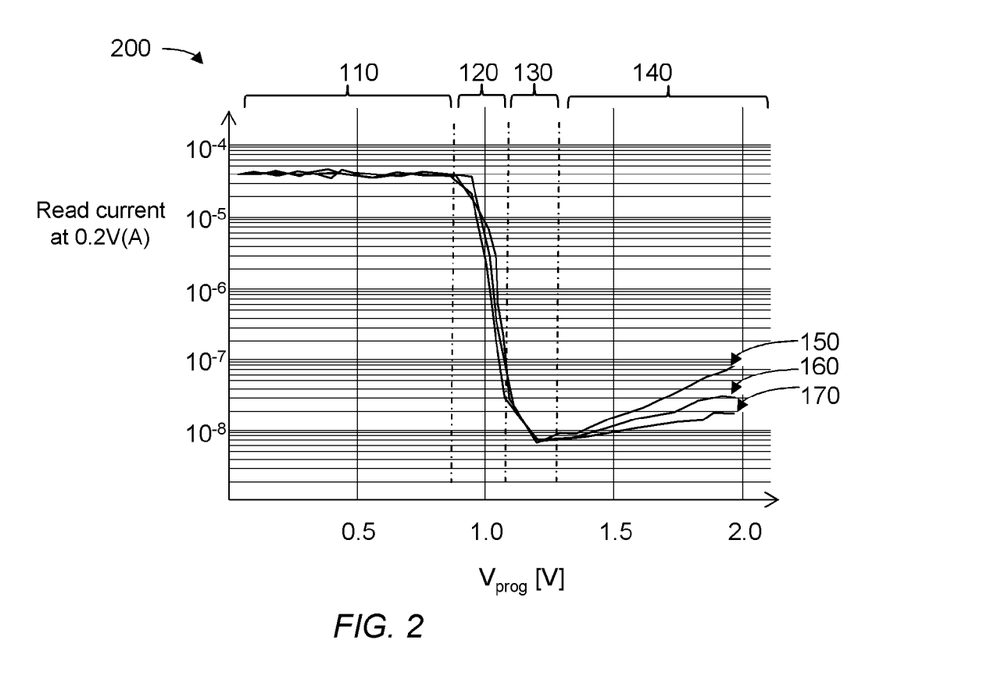
FIG. 2 is a graph representing information states and associated read current profiles of a phase change memory material according to an implementation.

FIG. 2 is a graph (200) representing information states and associated read current profiles of a phase change memory cell according to an implementation. FIG. 2 and the description below provide examples of programming voltages and read currents; the skilled artisan will appreciate that these are non-limiting examples and that other voltages and currents can be employed in other implementations. In FIG. 2, a phase change memory cell may be programmed by way of a programming waveform, $V_{prog}$, which may vary in amplitude from a lower bound of less than about 0.5 volts to an upper bound of about 2.0 volts, for example. As a result of applying a programming waveform having a peak amplitude of, for example, less than about 0.9 volts, a phase change memory cell may be programmed to a first information state 110 (e.g., a "SET" state), in which a higher electric current may flow through the cell as a result of an applied voltage compared to other information states. In FIG. 2, in the first information state 110, for example, read current of between about $3.0 \times 10^{-5}$ and about $5.0 \times 10^{-5}$ amperes may flow through a phase change memory cell as a result of an applied voltage of about 0.2 volts for a read operation. The first information state 110 can be a relatively lower resistance state compared to other information states of the cell, such as a crystalline state of a chalcogenide glass material.

In a second information state (e.g., an intermediate state between a "SET" and "RESET" state) of a phase change memory cell, a relatively large variation in read current may result, at least in part, from an applied voltage of about 0.2 volts, for example. In an implementation, such as that of FIG. 2, as a result of applying a programming waveform having a peak amplitude of, for example, between about 0.9 volts and about 1.1 volts, a phase change memory cell may be programmed to intermediate state 120. Intermediate state 120 may be a state of the phase change memory cell between the first information state 110 (e.g., a "SET" state) and a third information state 130 (e.g., a "RESET" state), for example. In the third information state 130 of FIG. 2, for example, a read current of between about $10^{-7}$ and about $10^{-8}$ amperes may flow through the cell as a result of an applied voltage of about 0.2 volts. A programming waveform having a peak amplitude of between about 1.1 volts and about 1.3 volts may be used to program the phase change memory cell to the third state 130, as shown in the example of FIG. 2.

In an implementation, a resistive memory cell may be programmed to an over-reset state, such as over-reset state 140 of FIG. 2. In an implementation, a waveform having an amplitude of, for example, between about 1.3 volts and about 2.0 volts, may be used to program a memory cell to an over-reset state in which an increasing current may flow through the cell as a result of an applied voltage of about 0.2 volts. In FIG. 2, for example, as a result of applying a programming voltage of between about 1.5 volts and about 2.0 volts, a read current of between about $10^{-8}$ amperes and about $10^{-7}$ amperes may flow as a result of applying a voltage of about 0.2 volts.

Figure 3:
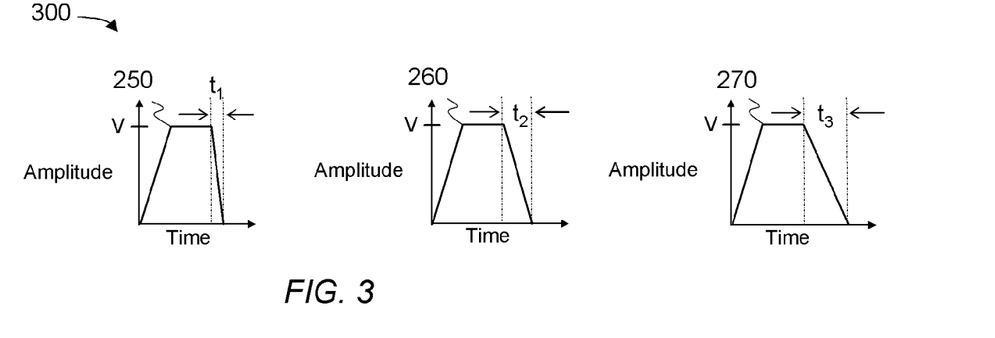
FIG. 3 is an illustration depicting example programming waveforms of varying fall times that can be used in a system to program over-reset state(s) in a phase change memory according to an implementation.

In FIG. 2, and as discussed further with reference to FIG. 3, for example, a plurality of programming waveforms may be used to program memory cells to a plurality of different over-reset states 140, such over-reset states 150, 160 and 170. In an implementation, these programming waveforms may differ in fall time and, in some implementations, these programming waveforms (i.e., the programming waveforms used to program a memory cell to a selected one of a plurality of different over-reset states) may only differ in fall time. To determine which of the plurality of over-reset states 150, 160, and 170 the memory cell is programmed to, a current can be sensed (e.g., read) from the memory cell in response to an applied voltage. Additionally, in some implementations, one or more of the plurality of programming waveforms may be generated from another programming waveform by adjusting a fall time from a peak amplitude, for example, to a lower threshold which may, for example, correspond to about 0.0 volts relative to a reference voltage.

For example, a first programming waveform having a peak amplitude of between about 1.3 volts and about 2.0 volts and having a first fall time may be used to program a memory cell to a first over-reset state 150, which may be particularly distinguishable from other information states (e.g., other over-reset states 160 and/or 170, a set state 110, some intermediate states 120, and/or a reset state 130) to which a memory cell may be selectively programmed. In an implementation, a memory cell may be determined to store the first over-reset state 150 if a current having an amplitude of about $10^{-7}$ amperes is read from the cell as a result of an applied voltage of about 0.2 volts, for example.

In addition, a second programming waveform, also having a peak amplitude of between about 1.3 volts 0.0 and about 2.0 volts, but having a second, different fall time may be used to program a memory cell to a second, different over-reset state 160. In an implementation, a memory cell may be determined to store the second over-reset state 160 if a current having an amplitude of about $3 \times 10^{-8}$ amperes is read from the cell as a result of an applied voltage of about 0.2 volts, for example. Further, a third programming waveform, again having a peak amplitude of between about 1.3 volts and about 2.0 volts, but having a third, different fall time may be used to program a memory cell to a third, different over-reset state 170. In an implementation, a memory cell may be determined to store the third over-reset state 150 if a current having an amplitude of about $2 \times 10^{-8}$ amperes is read from the cell as a result of an applied voltage of about 0.2 volts, for example.

FIG. 2 identifies three separate over-reset states 140 (e.g. over-reset states 150, 160 and 170), which together with the SET state represent four separate information states, each distinctly identifiable by measuring read current for a given read voltage; however, claimed subject matter is not limited in this respect. In other implementations, a greater or lesser number of over-reset states 140 may be utilized in programming memory cells. In some implementations, only set state 110, first over-reset state 150, second over-reset state 160 and third over-reset state 170 are used as information states. Other combinations of states can be used as information states in other implementations. For example, another implementation may only use set state 110, reset state 130, first over-reset state 150, and second over-reset state 160 as information states. Although implementations involving only four information states are discussed above, other implementations could use fewer or more information states (and/or different combinations of possible information states).

Accordingly, in at least one implementation, a SET state 110 of FIG. 2 and one or more over-reset state(s) 140 (such as 150, 160, 170), may be used as information states to represent logic values. Thus, in one possible example among many, a read current of about $4 \times 10^{-5}$ amperes may be assigned by a memory control unit, such as control unit 40 of phase change memory 30 (FIG. 1), logic state [00]. In an example, a read current of about $10^{-7}$ amperes may be assigned logic state [01]. In an example, a read current of about $3 \times 10^{-8}$ amperes may be assigned logic state [10]. In an example, a read current of about $2 \times 10^{-8}$ amperes may be assigned logic state [11]. However, the foregoing logic value assignments, read current levels, programming waveform amplitudes, and programming waveform fall times are merely examples and claimed subject matter is not limited in these respects. The foregoing examples are taken from FIG. 2 for an applied read voltage of about 0.2 V. It will be appreciated that different read currents may result from different applied read voltages, and that the particular voltages and currents for other implementations will depend upon a variety of factors including, for example, the composition and volume of phase change material in the cell.

FIG. 3 is an illustration depicting example programming waveforms (300) having different fall times used in a system for programming a phase change memory cell to a selected one of one or more over-reset state(s) according to an implementation. In FIG. 3, a first programming waveform 250 has a peak amplitude V and a fall time $t_1$ from the peak amplitude to a reference voltage, such as 0.0 volts. In some implementations, amplitude V may correspond, for example, to about 2.0 volts, as shown in FIG. 2. FIG. 3 also includes a second programming waveform 260, which may have a peak amplitude V and a fall time $t_2$. FIG. 3 also includes a third programming waveform 270, which may have a peak amplitude V and fall time t3. In some implementations, fall times $t_1$, $t_2$, and $t_3$ may correspond to periods ranging from at least about 10.0 to about 50.0 nanoseconds or lower. In other implementations, fall times may range from, for example, as low as about 5.0 nanoseconds or lower, to as high as about 100.0 nanoseconds or more, and claimed subject matter is not limited in this respect. Further programming waveforms may comprise triangular profiles, trapezoidal profiles, or other profiles, and claimed subject matter is not so limited. For example, triangular programming waveforms may resemble the illustrated waveforms by transitioning from rising edge to falling edge without the intervening voltage plateau.

Example programming waveforms 250, 260, and 270 may be used to respectively program a memory cell to over-reset states 150, 160, and 170 of FIG. 2. In one example among many, programming waveform 250, wherein t1 represents a fall time of about 10 nanoseconds, may correspond to over-reset state 150 of FIG. 2 and may be used to program a memory cell with a logic value of [01]. In another example, programming waveform 260, wherein $t_2$ represents a fall time of about 25 nanoseconds, may correspond to over-reset state 160 of FIG. 2 and may be used to program a memory cell with a logic value of [10]. In another example, programming waveform 270, wherein $t_3$ represents a fall time of about 35 nanoseconds, may correspond to over-reset state 170 of FIG. 2, and may be used to program a memory cell with a logic value of [11]. Thus, shorter fall times for the programming pulse can correspond to higher read currents for a given read operation voltage, which result from equivalent lower resistance over-reset states.

Figure 4:
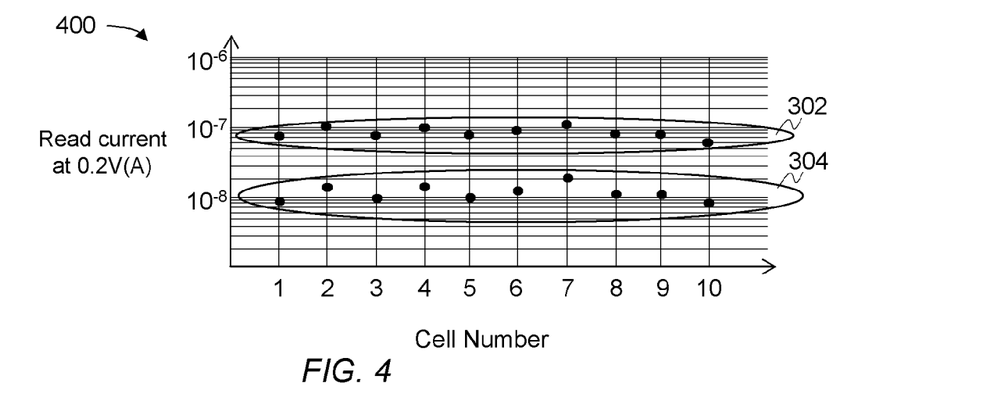
FIG. 4 is a graph representing repeatability of read current levels of memory cells used in a phase change memory device according to an implementation.

FIG. 4 is a graph (400) representing repeatability of read current levels of memory cells used in a phase change memory device according to an implementation. To arrive at the graph of FIG. 4, an implementation of ten memory cells comprising a phase change memory material corresponding to a chalcogenide material, specifically germanium-antimony-tellurium of stoichiometry "GST 225" ($Ge_2Sb_2Te_5$), were programmed by way of a programming waveform having a peak amplitude of about 2.0 volts. A first set of data points 302 corresponds to memory cells programmed by way of programming waveforms having a fall time of about 10.0 nanoseconds. A second set of data points 304 corresponds to memory cells programmed by way of programming waveforms having a fall time of about 50.0 nanoseconds. As may be inferred from FIG. 4, the first set of data points 302 and the second set of data points 304 demonstrate small variance in read current across each respective set of data points when a read voltage of about 0.2 volts is applied to the memory cells. The first set of data points 302 may be concentrated near $10^{-7}$ amperes, and the second set of data points 304 may be concentrated near $10^{-8}$ amperes.

In some implementations, repeatability demonstrated in FIG. 4 may be a result of relatively precise stoichiometric formulation of phase change memory material GST 225, for example. It may be contemplated that particular implementations may comprise phase change memory arrays that may include local fluctuations in composition across an array of memory cells. In one possible example, a $Ge_2Sb_2Te_5$ phase change memory cell of a memory array may comprise a slightly larger concentration of germanium than tellurium and/or antinomy, which, in chemical form, could be expressed loosely as $Ge_{2.01}Sb_2Te_{4.99}$. Additionally or alternatively, resistance of particular information states can drift over time. Accordingly, at least in some implementations, a calibration may be performed to adjust programming waveforms at different points of time and/or for particular memory cell locations of a phase change memory array.

Figure 5:
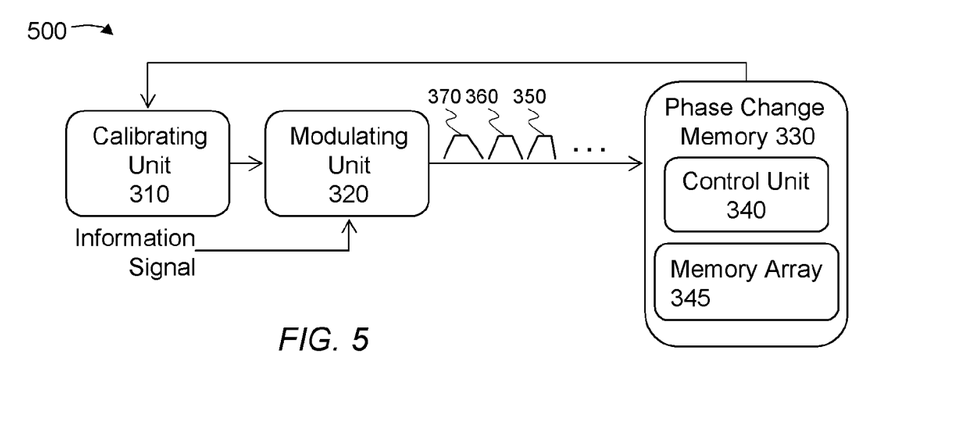
FIG. 5 is an illustration depicting a memory system for programming a memory cell to an over-reset state according to an implementation.

FIG. 5 is an illustration depicting a memory system 500 for programming a resistive memory cell to an over-reset state according to an implementation. FIG. 5 comprises a phase change memory 330 which may write to and read from a memory array 345 by way of a control unit 340. In an implementation, the memory array 345 may comprise memory cells capable of storing information states. In response to an information signal from a calibrating unit 310, a modulating unit 320 may adjust of one or more attributes, such as fall times, of programming waveforms conveyed to phase change memory unit 330. The calibrating unit 310 and modulating unit 320 may be implemented in hardware and/or software and may form part of a controller, such as the control unit 340, a separate processor or a combination of the control unit 340 and a separate processor(s). By adjusting fall times for programming waveforms, such as waveforms 350, 360, and 370, logic values conveyed by information signals can be stored in memory array 345.

A local calibration may be performed to adjust programming waveforms used to program memory cells of the memory array 345. Calibration may compensate for local fluctuations in composition of phase change materials used in a memory array. Calibration may alternatively or additionally compensate for drift in the resistance of resistive memory cells, such as phase change memory cells.

For example, to perform a calibration, a controller (e.g., control unit 340, modulating unit 320, and/or calibrating unit 310, either individually, in combination or in sub-combination) may program a memory cell(s) in the array 345 to a particular one of the information states. The memory cell(s) may be cell(s) used for data storage or test cell(s), such as cell(s) that is/are proximate with one or more memory cells used for data storage. For example, in some implementations, the test cell(s) may be near an edge of a memory block of the memory array 345.

In response to reading a memory cell (e.g., a test memory cell) programmed to a particular one of the information states, the controller (e.g., calibrating unit 310) may compare a current level sensed (e.g., read) from that memory cell with an expected current level for the particular programmed information state. Thus, returning to the example of FIG. 2, a current of about $10^{-7}$ amperes is expected to be read from a memory cell programmed to over-reset state 150 (e.g., representing a logic value of [01]). In the event that a current is read from a test memory cell programmed to over-reset state 150 that is greater than or less than $10^{-7}$ amperes (e.g., by some minimum threshold in some implementations), a fall time of a programming waveform used to program the test memory cell to the over-reset state 150 may be adjusted (e.g. increased or decreased). The calibrating unit 310 may convey a deviation, such as, for example +1.0 nanoseconds, from a nominal 10 nanosecond fall time corresponding to over-reset state 150 of FIG. 2. In some implementations, in response to comparing one or more currents sensed from a selected test cell(s), the calibrating unit 310 may recursively convey positive or negative deviations, for example, from a nominal fall time until a desired current is sensed from the test cell(s).

Figure 6:
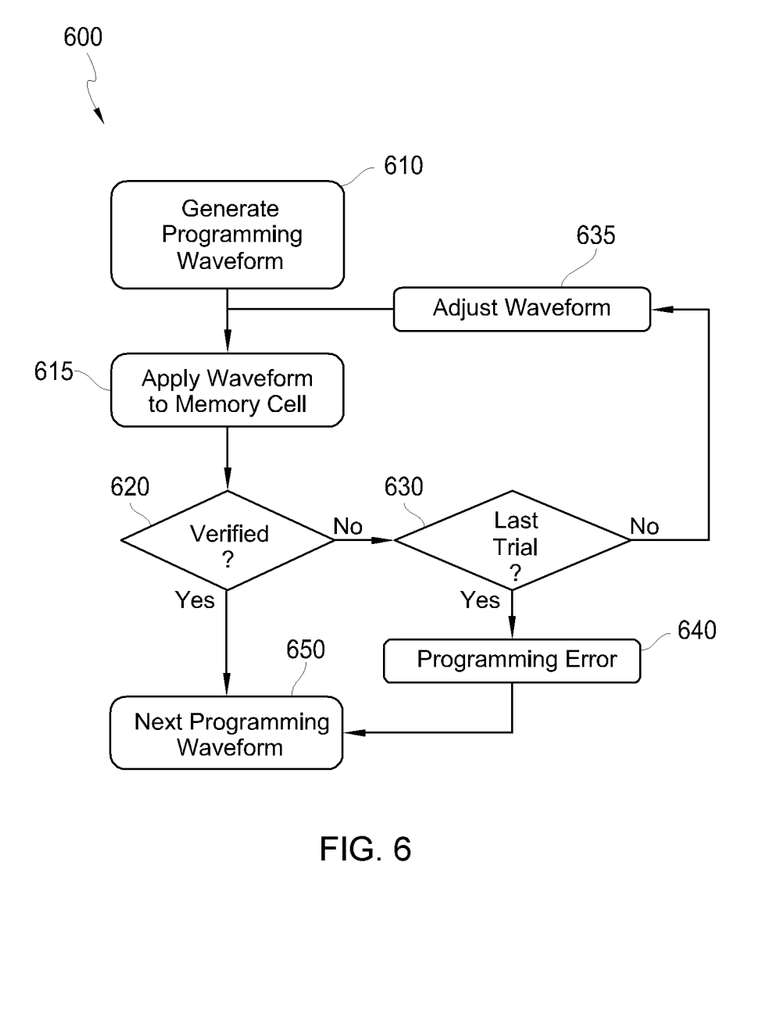
FIG. 6 is a flowchart depicting an example method for programming, including verifying and adjusting a programming waveform used to program one or more memory cells according to an implementation.

FIG. 6 is a flowchart depicting an example method for programming, including verifying and adjusting a programming waveform used to program one or more memory cells according to an implementation. The system of FIG. 5 may be suitable for performing the method of FIG. 6, although nothing prevents performing the method using alternate arrangements of components in other implementations. Verifying and adjusting, or otherwise calibrating, a programming waveform can be conducted periodically to account for drift in the phase change material's resistance over time. Additionally or alternatively, verification and adjustment of programming waveforms can be performed locally on test memory cells, e.g., during initial quality control testing, periodically during operation, or whenever programming is performed, to compensate for local differences in phase change material composition. For local calibration, the verification process can be performed with respect to one memory cell (e.g., a test memory cell) and the adjustment process applied to a programming waveform(s) used to program neighboring cell(s). The verification/adjustment process of FIG. 6, or variations thereof, can be performed in routine programming operations for any information state, or only for over-reset states. Example implementations may include blocks in addition to those shown and described, fewer blocks, blocks occurring in an order different from FIG. 6, or any combination thereof.

At block 610, a programming waveform may be generated. For example, a programming waveform having a peak amplitude of about 2.0 volts and a fall time of between about 5.0 nanoseconds and about 100.0 nanoseconds may be generated and applied to one or more memory cells of a phase change memory array. At block 615 the waveform is applied to a memory cell.

At block 620, one or more information states stored in one or more memory cells of a phase change memory array may be verified. Block 620 may comprise reading a signal from a memory cell, such as, e.g., a current or other signal corresponding to the resistance of the memory cell, that was programmed with the waveform generated in block 610, for example, and comparing the sensed signal (e.g., a logic value, current or resistance) with a signal that was expected to be sensed (e.g., read) from the memory cell. At block 630, if recursive verification is employed, a determination is made as to whether a final verification has been performed. If a final verification has not been performed, at block 635 a programming waveform may be adjusted, such as by increasing a fall time, decreasing a fall time, increasing or decreasing a programming voltage amplitude, adjusting a pulse profile, or by adjusting one or more other parameters of a programming waveform, and the adjusted waveform can be applied at block 615. Verification can be repeated at block 620 after application of the adjusted waveform.

If at block 630 it is determined that no further verifications are to be performed on the memory cell, at block 640 a programming error can be identified. Block 640 may comprise storing a list of unusable or problematic memory cells in a table accessible to a phase change memory control unit, such as control unit 340 of FIG. 5. At block 650, a programming waveform to be used for testing or otherwise programming a subsequent memory cell, or for programming the same memory cell to a different information state, may be selected and the method may return to 610.

In some implementations, programming waveforms may be applied to memory cells of a phase change memory without verifying contents. Thus, in many implementations programming can be conducted without verification, such that blocks 620, 630, 635 and 640 may be omitted from the programming process. In other implementations, a simplified verification by blocks 620 and 635 may be performed without recursive verification (omitting blocks 630 and 640), wherein a single adjustment, such as identified in block 635, for example, may be performed.

For phase change memory employing an over-reset state(s) as an information state(s), as described herein, either simplified verification or the looped verification of FIG. 6 can be simpler and faster than other phase change memory verification schemes. In particular, if a memory cell that was to be programmed to a particular information state is found upon verification to be outside the expected resistance range corresponding to that state, correction can be made without first resetting the cell. Rather, an adjusted programming waveform can be applied to adjust the resistance of the memory cell, without the need for first resetting the cell.

In one implementation, a method is disclosed, including applying a waveform resistive memory cell to program the memory cell to an over-set state representing a logic value.

Applying the first programming waveform can additionally include applying a waveform having a fall time of between about 5.0 nanoseconds and about 100.0 nanoseconds, wherein the fall time corresponds to the logic value to be represented by the over-reset state. The waveform can include a triangular profile or a trapezoidal profile. The method can also include applying a second waveform to the memory cell to program the memory cell to a second over-reset state, different from the first over-reset state. The second waveform can be applied applier applying the first waveform and before resetting the memory cell. The method can also include applying a third waveform to program the memory cell to a third over-reset state, different from the first and second over-reset states. The first and second programming can have different fall times and the first and second over-reset states can have different ranges of resistances of the memory cell. The method can also include calibrating the waveform by verifying a signal sensed from the memory cell against an expected signal. Calibrating can include comparing the signal sensed from the memory cell with the expected read signal and adjusting the waveform based upon the comparison. Adjusting the waveform can include adjusting a fall time of the waveform. Calibrating can include comprises recursively verifying the waveform. Applying the waveform to a resistive memory cell can include applying the waveform to a phase change memory cell.

In another implementation, a device is disclosed that includes a controller configured to adjust a fall time of a waveform used to program a resistive memory cell to an over-reset state representing a logical value.

The can be configured to adjust the fall time of the waveform to at least about 10 nanoseconds. The controller can be configured to adjust the fall time of the waveform to less than about 100 nanoseconds. The resistive memory cell can include a phase change memory cell. The controller can also be configured to compare a signal sensed from the memory cell after applying the waveform to an expected signal. The controller can be configured to adjust the fall time of the waveform to obtain a sensed signal closer to the expected signal.

In another implementation, a system is provided that includes an array of resistive memory cells. The system includes a controller coupled to the array, where the controller is configured to apply a waveform to a selected one of a plurality of over-reset states, wherein each of the plurality of reset states represents a respective logic value of a plurality of logic values.

The controller can include a controller configured to apply a selected one of at least two different waveforms to a selected memory cell to program the selected memory cell to a respective one of at least two different over-reset states. The controller can be configured to apply a selected one of at least three different waveforms to the selected memory cell to program the selected memory cell to a respective one of at least three different over-reset states. The at least two different waveforms can have different fall times. The controller can be configured to adjust a fall time of the waveform based, at least in part, on a signal sensed from the selected one of the memory cells or a neighboring cell of the array. Each of the memory cells can include a resistive memory material. Each of the memory cells can include a phase change memory material. The phase change material can include a chalcogenide material. The phase change material can include germanium, antimony and tellurium. The waveform can have a peak amplitude of between about 1.0 volt and 3.0 volts and a fall time of between about 10 ns and about 100 ns. The waveform can have a triangular or trapezoidal profile.

The term "computing platform" as used herein refers to a device that includes an ability to process and/or store data in the form of signals and/or states. Thus, a computing platform, in this context, may comprise hardware, software, firmware or any combination thereof (other than software per se). Computing platform 100, as depicted in FIG. 1, is merely one such example, and the scope of claimed subject matter is not limited to this particular example. For one or more implementations, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, micro-controllers, microprocessors, electronic devices, or other devices designed to perform functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or devices that would be known by one of ordinary skill have not been described in detail so as not to obscure claimed subject matter.

Some portions of the preceding detailed description have been presented in terms of logic, algorithms and/or symbolic representations of operations on information states stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of manipulating and/or transforming signals and/or states, typically represented as physical electronic and/or magnetic quantities within memory devices, transmission devices, and/or display devices of the special purpose computer and/or similar special purpose computing device. In the context of this particular patent application, the term "specific apparatus" may include a general purpose computing device, such as a general purpose computer, once it is programmed to perform particular functions pursuant to instructions from program software.

In some circumstances, operation of a memory device, such as a change in an information state from one representing a binary one to one representing a binary zero or vice-versa, for example, may comprise a transformation, such as a physical transformation. With particular types of memory devices, such a physical transformation may comprise a physical transformation of an article to a different state. For example, but without limitation, for some types of memory devices, a change in information state may involve an accumulation and/or storage of charge or a release of stored charge. Likewise, in other memory devices, a change of information state may comprise a physical change, such as a transformation in magnetic orientation and/or a physical change or transformation in molecular structure, such as from crystalline to amorphous or vice-versa. In still other memory devices, a change in information state may involve quantum mechanical phenomena, such as, superposition, entanglement, and/or the like, which may involve quantum bits (qubits), for example. The foregoing is not intended to be an exhaustive list of all examples in which a change in an information state of a memory cell from one representing a binary one to one representing a binary zero or vice-versa in a memory device may comprise a transformation, such as a physical transformation. Rather, the foregoing is intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

We claim:

1. A method, comprising:
applying a waveform to a resistive memory cell in a memory array to program the memory cell to an over-reset state representing a logic value, wherein the waveform has a single fall time that is longer than a corresponding fall time of a different waveform that has been applied to a different memory cell in the memory array for a reset state or a second over-reset state representing a second logic value and having a resistance higher than that of the over-reset state.

2. The method of claim 1, wherein applying the waveform further comprises applying a waveform having a fall time of between about 5.0 nanoseconds and about 100.0 nanoseconds, wherein the fall time corresponds to the logic value to be represented by the over-reset state.

3. The method of claim 2, wherein the waveform comprises a triangular profile.

4. The method of claim 2, wherein the waveform comprises a trapezoidal profile.

5. The method of claim 1, wherein the waveform comprises a first waveform, and the over-reset state comprises a first over-reset state, the method further comprising:

applying a second waveform to the memory cell to program the memory cell to the second over-reset state, different from the first over-reset state.

6. The method of claim 5, wherein the second waveform is applied after applying the first waveform and before resetting the memory cell.

7. The method of claim 5, further comprising:
applying a third waveform to the memory cell to program the memory cell to a third over-reset state, different from the first and second over-reset states.

8. The method of claim 1, additionally comprising:
calibrating the waveform by verifying a signal sensed from the memory cell against an expected signal.

9. The method of claim 8, wherein calibrating comprises:
comparing the signal sensed from the memory cell with the expected signal; and
adjusting the waveform based upon the comparison.

10. The method of claim 9, wherein adjusting the waveform comprises adjusting a fall time of the waveform.

11. The method of claim 8, wherein calibrating comprises recursively verifying the waveform.

12. The method of claim 1, wherein applying a waveform to a resistive memory cell comprises applying the waveform to a phase change memory cell.

13. A device, comprising:
a controller configured to adjust a fall time of a waveform used to program a resistive memory cell in a memory array to an over-reset state representing a logical value, wherein the controller is configured to adjust the fall time to be different than a fall time of a different waveform that has been applied to a different memory cell in the memory array at a reset state different than the over-reset state.

14. The device of claim 13, wherein the controller is configured to adjust the fall time of the waveform to at least about 10 nanoseconds.

15. The device of claim 14, wherein the controller is configured to adjust the fall time of the waveform to less than about 100 nanoseconds.

16. The device of claim 13, wherein the resistive memory cell comprises a phase change memory cell.

17. The device of claim 13, wherein the controller is further configured to compare a signal sensed from the memory cell after applying the waveform with an expected signal.

18. The device of claim 17, wherein the controller is configured to adjust the fall time of the waveform to obtain a sensed signal closer to the expected signal.

* * * * *